United States Patent
Morino (10) Patent No.: US 9,460,979 B2
(45) Date of Patent: Oct. 4, 2016

(54) ELECTRONIC DEVICE HAVING HEAT CONDUCTING MEMBER

(71) Applicant: DENSO CORPORATION, Kariya, Aichi-pref. (JP)

(72) Inventor: Seiji Morino, Kariya (JP)

(73) Assignee: DENSO CORPORATION, Kariya, Aichi-pref. (JP)

(*) Notice: Subject to any disclaimer, the term of this patent is extended or adjusted under 35 U.S.C. 154(b) by 0 days.

(21) Appl. No.: 14/945,095

(22) Filed: Nov. 18, 2015

(65) Prior Publication Data

US 2016/0141221 A1 May 19, 2016

(30) Foreign Application Priority Data

Nov. 19, 2014 (JP) ................. 2014-234449

(51) Int. Cl.
*H01L 23/34* (2006.01)
*H01L 23/36* (2006.01)
*H01L 23/498* (2006.01)
*H01L 23/053* (2006.01)

(52) U.S. Cl.
CPC ............. *H01L 23/36* (2013.01); *H01L 23/053* (2013.01); *H01L 23/49844* (2013.01)

(58) Field of Classification Search
CPC .................................................. H01L 23/3675
USPC ........................................ 257/717, 712, 707
See application file for complete search history.

(56) References Cited

U.S. PATENT DOCUMENTS

| 7,019,395 B2* | 3/2006 | Hirano | ............. H01L 23/4338 257/707 |
| 9,287,193 B2* | 3/2016 | Orimoto | ............. H01L 24/33 |
| 2014/0225482 A1 | 8/2014 | Hara et al. | |

FOREIGN PATENT DOCUMENTS

JP 2012-079741 A 4/2012

OTHER PUBLICATIONS

U.S. Appl. No. 14/947,924, filed Nov. 20, 2015, Morino, Seiji.

* cited by examiner

*Primary Examiner* — Dung Le
(74) *Attorney, Agent, or Firm* — Knobbe, Martens, Olson & Bear, LLP (57) ABSTRACT

An electronic device includes a semiconductor module, a wiring substrate, a case member and a heat conducting member. The heat conducting member thermally connects predetermined portions of wiring patterns and a heat conducting pattern of the wiring substrate to a predetermined heat conduction region of a surface of the case member opposing to the wiring substrate. The predetermined heat conduction region is located further from the wiring substrate than a surface of a body portion opposing to the case member. As a result, heat can be radiated and a short can be restricted with the case member having a simple shape. The heat conducting pattern is disposed adjacent to at least one of non-terminal projecting surfaces of the body portion on a surface of the wiring substrate. As a result, an area of a heat conducting passage increases and heat radiation performance can be increased.

7 Claims, 9 Drawing Sheets

ELECTRONIC DEVICE HAVING HEAT CONDUCTING MEMBER

CROSS REFERENCE TO RELATED APPLICATION

This application is based on Japanese Patent Application No. 2014-234449 filed on Nov. 19, 2014, the disclosure of which is incorporated herein by reference.

TECHNICAL FIELD

The present disclosure relates to an electronic device including a semiconductor module, a wiring substrate and a case member, and radiating heat generated in the semiconductor module through a heat conducting member.

BACKGROUND

For example, an electronic control unit disclosed in JP 2014-154745 A (patent literature 1) is an electronic device including a semiconductor module, a wiring substrate and a case member, and radiating heat generated in the semiconductor module through the case member.

The electronic control unit disclosed in the patent literature 1 includes a semiconductor module, a substrate, a frame end and a first heat conducting member. The substrate and the frame end correspond to the wiring substrate and the case member.

The semiconductor module includes a body with a rectangular parallelepiped shape, and terminal portions projecting from a side surface of the body. The semiconductor module further includes a first metallic board exposing from a surface of the body portion opposing to the substrate. The first metallic board corresponds to the terminal portion. The substrate has a first wiring pattern to which the first metallic board is electrically connected, and second wiring patterns to which the terminal portions are connected. The frame end is made of metal. The frame end includes a body portion opposing to the substrate, to which the semiconductor module is electrically connected. The frame end further includes a first specific shape portion projecting from the body portion toward the substrate and forming a small first clearance with the first wiring pattern. In order to form the small first clearance, the first specific shape portion projects to a position nearer the first wiring pattern than a surface of the body of the semiconductor module opposing to the frame end. The first heat conducting member has an electrical insulation property and is disposed in the first clearance.

Heat generated in the semiconductor module is conducted to the first specific shape portion through the first metallic board, the first wiring pattern and the first heat conducting member. Then, the heat is radiated outside through the body portion of the frame end.

SUMMARY

In the electronic control unit described above, the body portion of the frame end has the first specific shape portion projecting toward the substrate and to the position nearer the first wiring pattern than the surface of the body of the semiconductor module opposing to the frame end. Therefore, the frame end has a complicated shape.

When the first specific shape portion is arranged near the semiconductor module, a distance from the semiconductor module to the first specific shape portion decreases, and thermal resistance of a heat conducting passage decreases. As a result, heat radiation performance increases. On the other hand, possibility of a short between the semiconductor module and the first specific shape portion increases.

Conversely, when the first specific shape portion is arranged far from the semiconductor module, the distance from the semiconductor module to the first specific shape portion increases, and the possibility of the short between the semiconductor module and the first specific shape portion decreases. On the other hand, the thermal resistance of the heat conducting passage increases, and the heat radiation performance decreases.

It is an object of the present disclosure to provide an electronic device having a case member with a simple shape, and capable of restricting a short and increasing heat radiation performance.

According to an aspect of the present disclosure, an electronic device includes a semiconductor module, a wiring substrate, a case member, a heat conducting member. The semiconductor module has a body portion with a rectangular parallelepiped shape and a plurality of terminal portions projecting from two of four side surfaces of the body portion. The two of the four side surfaces of the body portion are referred to as terminal projecting surfaces. The other two of the four side surfaces of the body portion are referred to as terminal non-projecting surfaces. The wiring substrate has a plurality of wiring patterns and a heat conducting pattern. Surfaces of the plurality of wiring patterns other than a plurality of connecting portions to which the terminal portions of the semiconductor module are electrically connected and a surface of the heat conducting pattern are covered with solder resist. The heat conducting pattern is disposed adjacent to at least one of the terminal non-projecting surfaces of the body portion on a surface of the wiring substrate. The case member is opposed to the wiring substrate and spaced from the wiring substrate. The heat conducting member thermally connects predetermined portions of the wiring patterns and the heat conducting pattern to a predetermined heat conduction region of the case member. The predetermined heat conduction region is a surface of the case member opposing to the wiring substrate and is located further from the wiring substrate than a surface of the body portion opposing to the case member.

According to a structure described above, the electronic device includes the heat conducting member. The heat conducting member thermally connects the predetermined portions of the wiring patterns and the heat conducting pattern to the predetermined heat conduction region of the case member. The predetermined heat conduction region is the surface of the case member opposing to the wiring substrate and is located further from the wiring substrate than the surface of the body portion opposing to the case member. Therefore, the case member needs not to have a portion projecting toward the wiring substrate and to a position nearer the wiring patterns than the surface of the body portion opposing to the case member. Hence, heat can be radiated from the case member with a simple shape. Since the projecting portion of the case member is not arranged near the semiconductor module, a short is less likely to occur. Also, the electronic device includes the wiring substrate having the heat conducting pattern. The heat conducting pattern is disposed adjacent to at least one of the terminal non-projecting surfaces of the body portion on the surface of the wiring substrate. Hereinafter, areas of the surface of the wiring substrate adjacent to the terminal non-projecting surfaces of the body portion are referred to as terminal non-corresponding areas. Areas of the surface of the wiring substrate adjacent to the terminal projecting surfaces are referred to as terminal corresponding areas. That is, the heat conducting pattern is disposed at one of the terminal non-corresponding areas of the surface of the wiring substrate. The surface of the heat conducting pattern is covered with the solder resist. The wiring patterns, which are electrically connected to the terminal portions, are disposed at the terminal corresponding areas of the surface of the wiring substrate. On the other hand, the wiring patterns are not disposed at the terminal non-corresponding areas of the surface of the wiring substrate. Therefore, the heat conducting pattern can be disposed at the one of the terminal non-corresponding areas. As such, an area of a heat conducting passage can be increased compared to a case where the heat is conducted to the case member only through the wiring patterns. That is, thermal resistance can be decreased and heat radiation performance can be increased. As a result, an occurrence of the short can be restricted and the heat radiation performance can be increased without complicating a shape of the case member.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Embodiments of the present disclosure will be described. In the present embodiments, an example where an electronic device according the present disclosure is employed to a motor control device equipped to a vehicle and controlling a motor will be described.

First Embodiment

A structure of a motor control device of a first embodiment will be described with reference to FIG. 1 to FIG. 13. Hereinafter, a vertical direction and a horizontal direction in the description correspond to a vertical direction and a horizontal direction in the drawings. Namely, "right", "left", "upper" "lower", "top" and "bottom" correspond to respective directions in the drawings.

Figure 1:
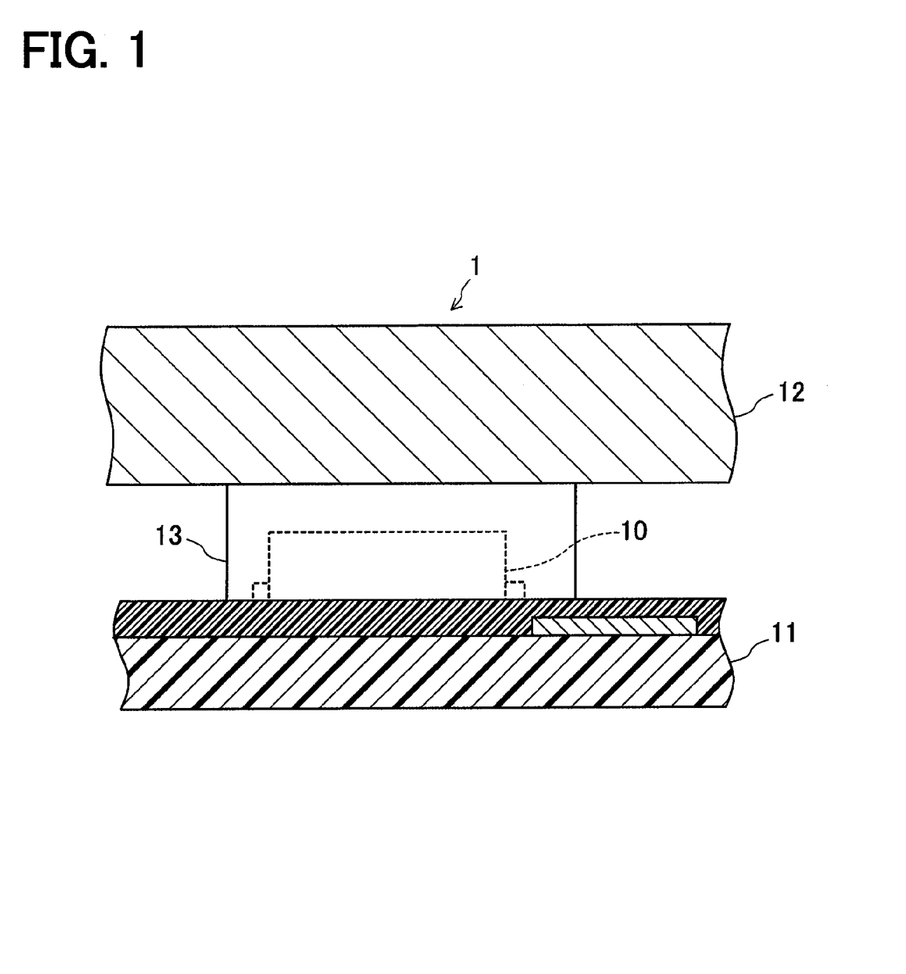
FIG. 1 is a cross-sectional view of a motor control device according to a first embodiment.

A motor control device 1 (electronic device) shown in FIG. 1 is equipped to a vehicle and controls a motor assisting a steering of a steering wheel. The motor control device 1 includes a FET module 10 (semiconductor module), a wiring substrate 11, a case member 12 and a heat conducting member 13.

The FET module 10 is a surface-mounted element composing an inverter circuit.

Figure 2:
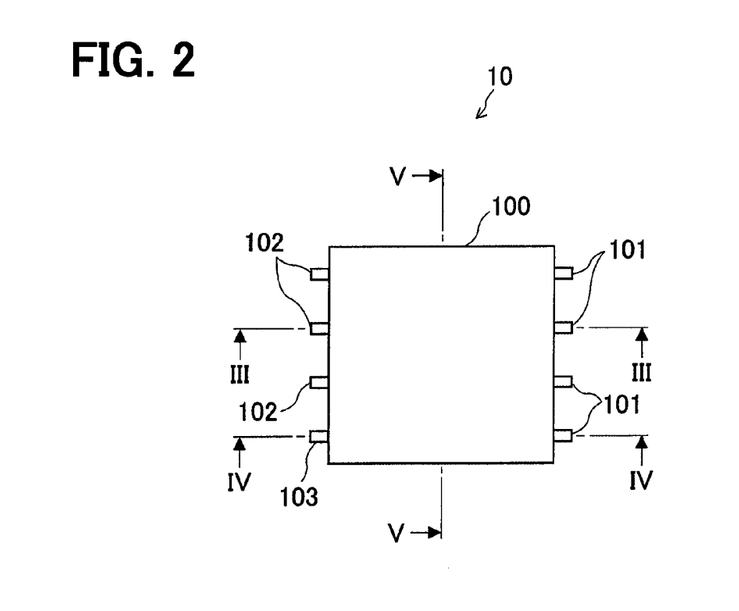
FIG. 2 is a plan view of a FET module shown in FIG. 1.

As shown in FIG. 2, the FET module 10 includes a body portion 100, drain terminal portions 101, source terminal portions 102 and a gate terminal potion 103 in appearance.

The body portion 100 is made of resin and has a rectangular parallelepiped shape.

The drain terminal portions 101 provide drain terminals of the FET module 10. There are four drain terminal portions 101 projecting from one of four side surfaces of the body portion 100, such as a right side surface in FIG. 2.

The source terminal portions 102 provide source terminals of the FET module 10. There are three source terminal portions 102 projecting from another one of the four side surfaces of the body portion 100, such as a left side surface in FIG. 2.

The gate terminal portion 103 provides a gate terminal of the FET module 10. The gate terminal portion 103 projects from the left side surface of the body portion 100. The gate terminal portion 103 is shown lower than the source terminal portions 102 in FIG. 2, that is, located adjacent to further another side surface of the body portion 100, such as a lower side surface in FIG. 2. Hereinafter, two of the four side surfaces of the body portion 100 from which the drain terminal portions 101, the source terminal portions 102 and the gate terminal portion 103 project are referred to as terminal projecting surfaces. The other two of the four side surfaces of the body portion 100 from which the drain terminal portions 101, the source terminal portions 102 and the gate terminal portion 103 do not project are referred to as terminal non-projecting surfaces.

Figure 3:
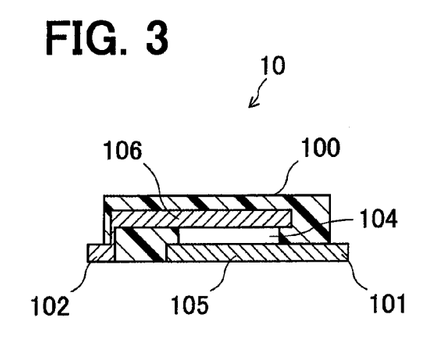
FIG. 3 is a cross-sectional view taken along a line in FIG. 2.
Figure 4:
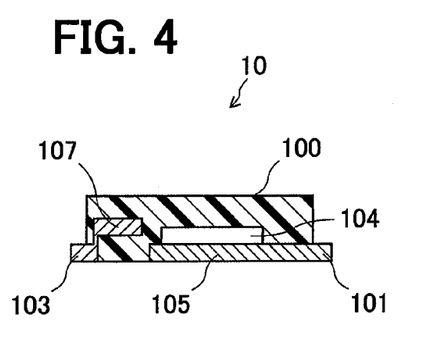
FIG. 4 is a cross-sectional view taken along a line IV-IV in FIG. 2.
Figure 5:
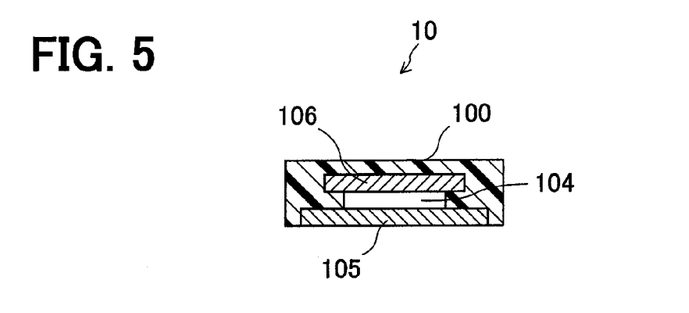
FIG. 5 is a cross-sectional view taken along a line V-V in FIG. 2.

As shown in FIG. 3 to FIG. 5, the FET module 10 structurally includes a semiconductor chip 104, a drain terminal member 105 (first terminal member), a source terminal member 106 and a gate terminal member 107. In FIG. 3 to FIG. 5, the drain terminal member 105, the source terminal member 106 and the gate terminal member 107 are shown with dimensions emphasized compared to actual dimensions in the vertical direction for easier understanding.

The drain terminal member 105 is a thin metallic plate. The drain terminal member 105 includes the drain terminal portions 101. The drain terminal portions 101 project from a bottom portion of the terminal projecting surface of the body portion 100. The drain terminal member 105 further includes a predetermined portion other than the drain terminal portions 101. Hereinafter, the predetermined portion of the drain terminal member 105 is referred to as a drain predetermined portion. The drain predetermined portion is electrically connected to a drain that is provided at a bottom surface of the semiconductor chip 104. The drain predetermined portion has a bottom surface exposed from a surface of the body portion 100 opposing to the wiring substrate. That is, the drain predetermined portion is exposed from a bottom surface of the body portion 100. In other words, the bottom surface of the drain predetermined portion is not covered with the body portion 100.

As shown in FIG. 3 and FIG. 5, the source terminal member 106 is a thin metallic plate. The source terminal member 106 includes the source terminal portions 102. The source terminal portions 102 project from a bottom portion of the terminal projecting surface of the body portion 100. The source terminal member 106 further includes a predetermined portion other than the source terminal portions 102. Hereinafter, the predetermined portion of the source terminal member 106 is referred to as a source predetermined portion. The source predetermined portion is electrically connected to a source that is provided at a top surface of the semiconductor chip 104. The source predetermined portion is implanted in the body portion 100.

As shown in FIG. 4, the gate terminal member 107 is a thin metallic plate. The gate terminal member 107 includes the gate terminal portion 103. The gate terminal portion 103 projects from the bottom portion of the terminal projecting surface of the body portion 100. The gate terminal member 107 further includes a predetermined portion other than the gate terminal portion 103. Hereinafter, the predetermined portion of the gate terminal member 107 is referred to as a gate predetermined portion. The gate predetermined portion is electrically connected to a gate that is provided at the top surface of the semiconductor chip 104, through a wire (not illustrated). The gate predetermined portion is implanted in the body portion 100.

The wiring substrate 11 shown in FIG. 1 wires the FET module 10. As shown in FIG. 6 to FIG. 9, the wiring substrate 11 includes a substrate base 110, wiring patterns 111 to 113, heat conducting patterns 114, 115 and solder resist 116.

The substrate base 110 is a resin board having an electrical insulation property.

The wiring pattern 111 is a member made of metal and having a thin plate shape. The wiring pattern 111 wires the drain terminal portions 101. Also, the wiring pattern 111 conducts heat generated in the body portion 100. The body portion 100 is arranged at a center portion of the wiring substrate 11 shown in FIG. 6 in a state where the drain terminal portions 101 project form the right side surface of the body portion 100 and the source terminal portions 102 and the gate terminal portion 103 project from the left side surface of the body portion 100. The wiring pattern 111 extends from the center portion of the wiring substrate 11 in a right direction, and extends in the vertical direction. The wiring pattern 111 has four connecting portions 111a, which are electrically connected to the drain terminal portions 101. The connecting portions 111a are arranged in the vertical direction at a right section of the center portion of the wiring substrate 11. The wiring pattern 111 also has a connecting portion 111b, which is electrically connected to the drain predetermined portion. The connecting portion 111b is disposed at the center portion of the wiring substrate 11. The connecting portions 111a continuously extend from the connecting portion 111b.

Figure 6:
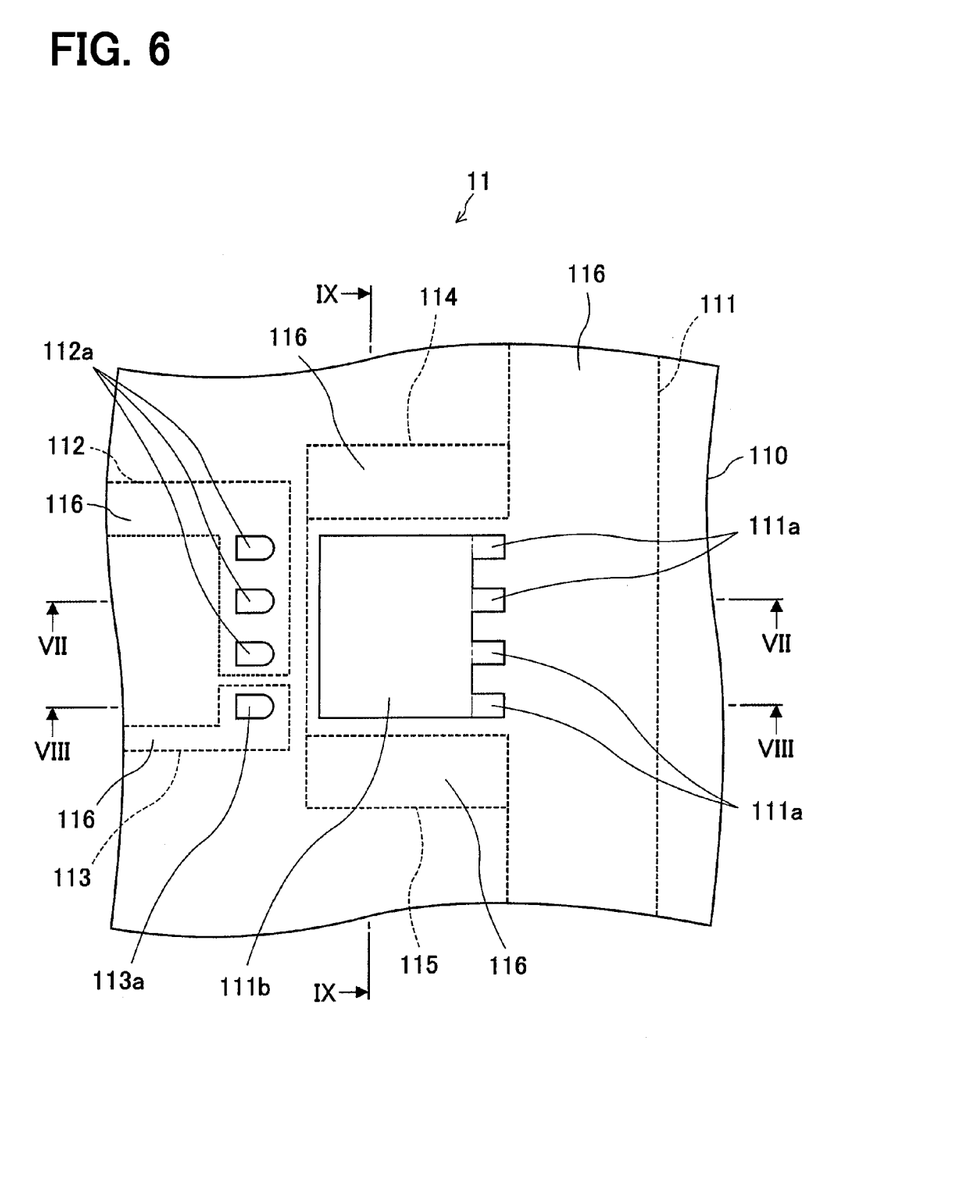
FIG. 6 is a plan view of a wiring substrate shown in FIG. 1.
Figure 7:
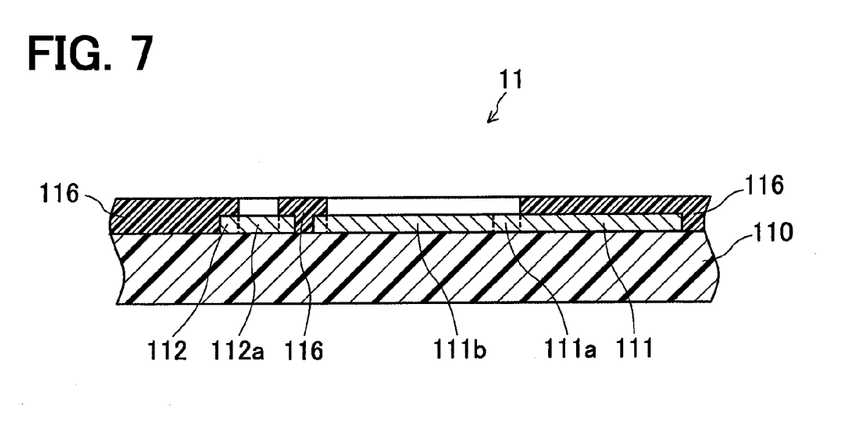
FIG. 7 is a cross-sectional view taken along a line VII-VII in FIG. 6.

The wiring pattern 112 shown in FIG. 6 and FIG. 7 is a member made of metal and having a thin plate shape. The wiring pattern 112 wires the source terminal portions 102. Also, the wiring pattern 112 conducts the heat generated in the body portion 100. As shown in FIG. 6, the wiring pattern 112 extends in an upper direction along a left section of the center portion, and extends in a left direction. The wiring pattern 112 has three connecting portions 112a, which are electrically connected to the source terminal portions 102. The connecting portions 112a are arranged in the vertical direction at the left section of the center portion of the wiring substrate 11.

Figure 8:
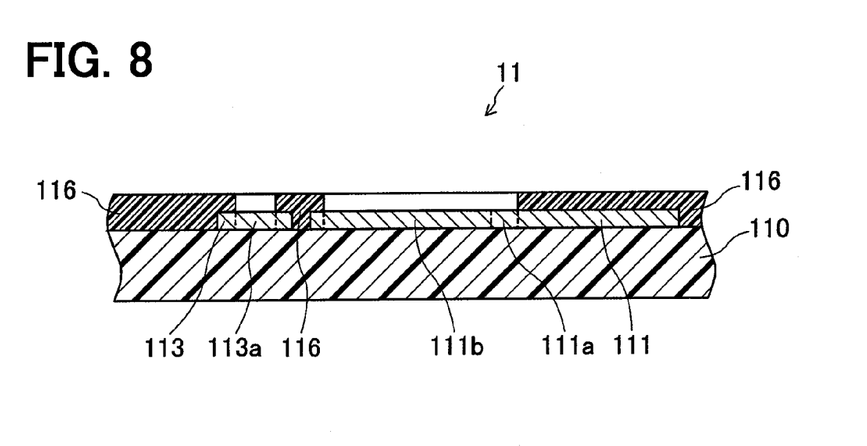
FIG. 8 is a cross-sectional view taken along a line VIII-VIII in FIG. 6.

The wiring pattern 113 shown in FIG. 6 and FIG. 8 is a member made of metal and having a thin plate shape. The wiring pattern 113 wires the gate terminal portion 103. Also, the wiring pattern 113 conducts the heat generated in the body portion 100. As shown in FIG. 6, the wiring pattern 113 extends in a lower direction along the left section of the center portion and extends in the left direction. The wiring pattern 113 is disposed lower than the wiring pattern 112. The wiring pattern 113 has one connecting portion 113a, which is electrically connected to the gate terminal portion 103. The connecting portion 113a is disposed at the left section of the center portion of the wiring substrate 11 and lower than the wiring pattern 112.

Figure 9:
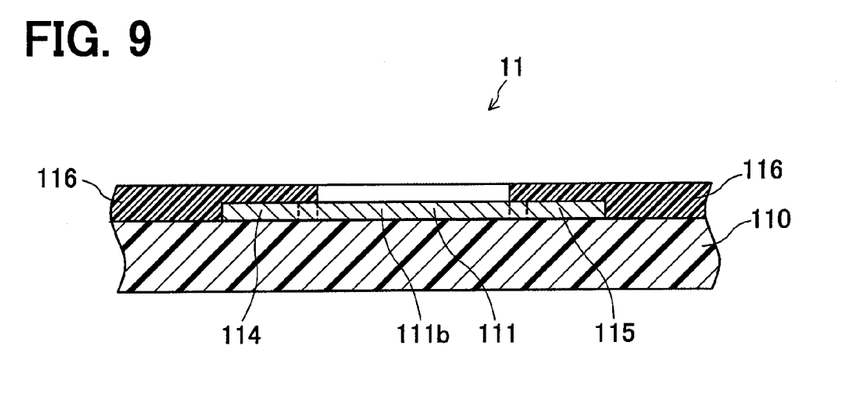
FIG. 9 is a cross-sectional view taken along a line IX-IX in FIG. 6.

The heat conducting patterns 114, 115 shown in FIG. 6 and FIG. 9 are members made of metal and have a thin plate shape. The heat conducting patterns 114, 115 conduct the heat generated in the body portion 100. As shown in FIG. 6, the heat conducting patterns 114, 115 extend in the horizontal direction at a portion above the center portion and a portion under the center portion. That is, the heat conducting patterns 114, 115 are located at opposite sides of the center portion of the wiring substrate 11. In other words, the heat conducting patterns 114, 115 are disposed at portions of the surface of the wiring substrate 11, the portions being adjacent to the terminal non-projecting surfaces the body portion 100. Hereinafter, areas of the surface of the wiring substrate 11 adjacent to the terminal non-projecting surfaces of the body portion 100 are referred to as terminal non-corresponding areas. Areas of the surface of the wiring substrate 11 adjacent to the terminal projecting surfaces are referred to as terminal corresponding areas. The heat conducting patterns 114, 115 are disposed along the terminal non-projecting surfaces of the body portion 100 and disposed near the body portion 100. The heat conducting patterns 114, 115 are integrally formed with the wiring pattern 111.

The solder resist 116 shown in FIG. 6 to FIG. 9 is a member having the electrical insulation property. The solder resist 116 protects the surface of the wiring substrate 11. Also, the solder resist 116 regulates flow of solder that is used for electrically connecting the FET module 10 to the wiring patterns 111 to 113. The solder resist 116 covers the entirety of the substrate base 110 of the wiring substrate 11, except for the connecting portions 111a, 111b, 112a and 113a. Therefore, the wiring patterns 111 to 113 have the surfaces covered with the solder resist 116 except for the connecting portions 111a, 111b, 112a and 113a. The heat conducting patterns 114, 115 have the surfaces covered with the solder resist 116.

Figure 10:
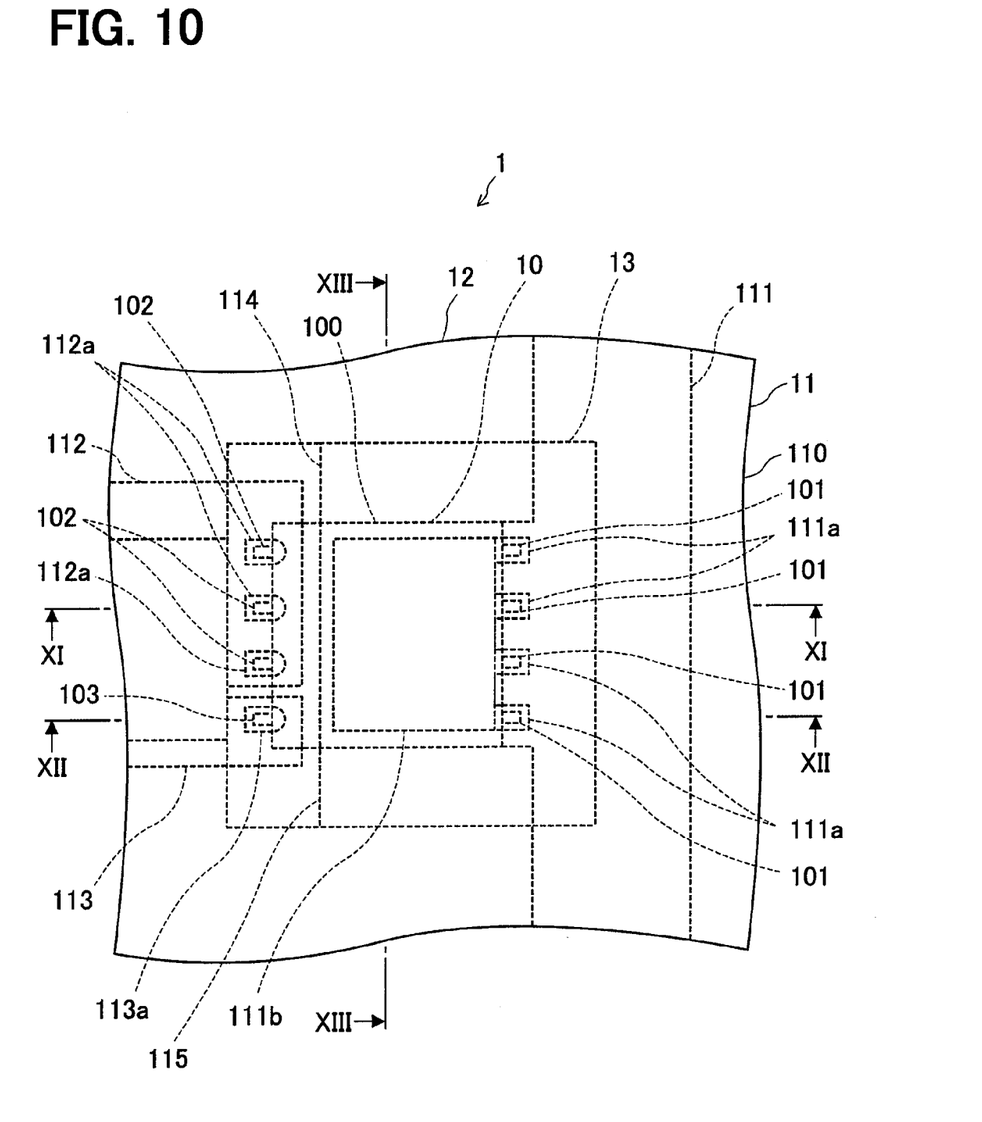
FIG. 10 is a plan view of the motor control device according to the first embodiment.
Figure 11:
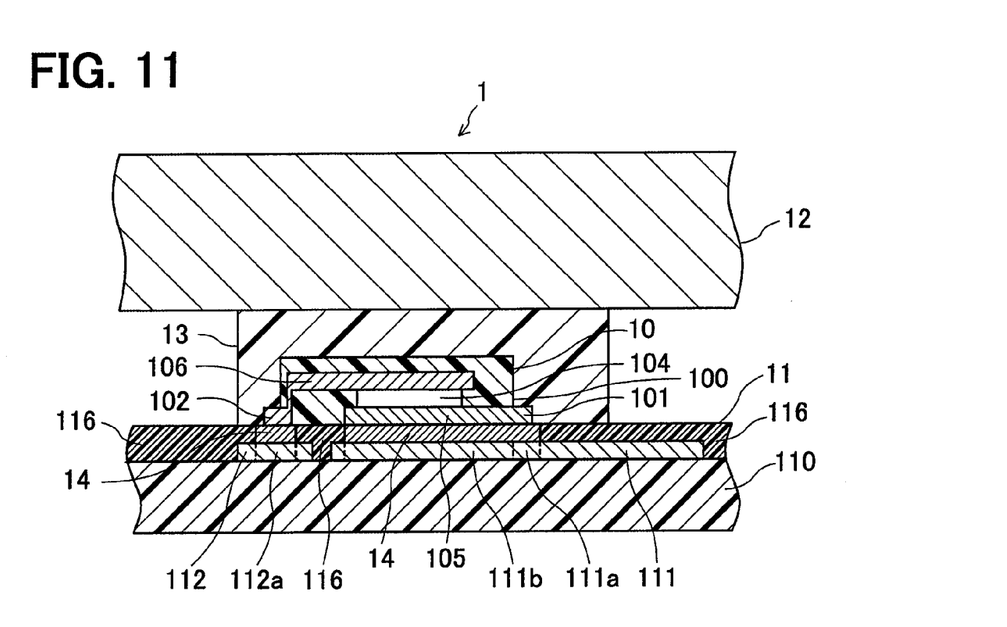
FIG. 11 is a cross-sectional view taken along a line XI-XI in FIG. 10.
Figure 12:
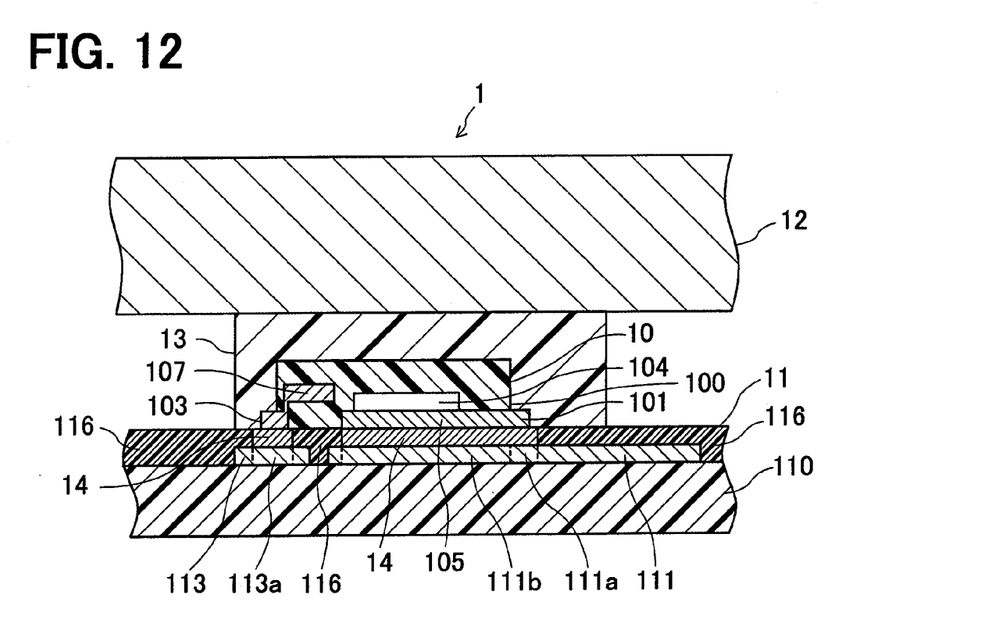
FIG. 12 is a cross-sectional view taken along a line XII-XII in FIG. 10.
Figure 13:
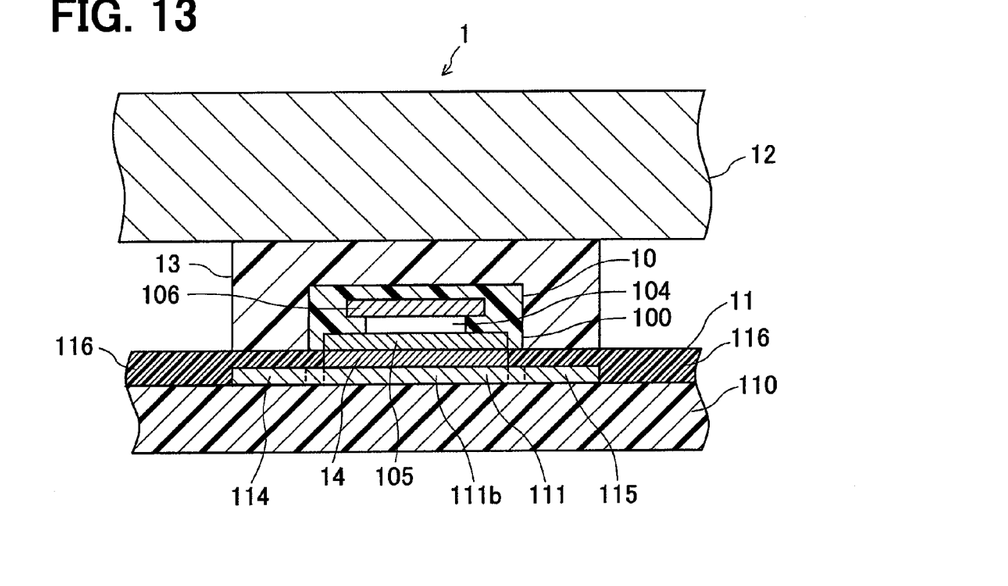
FIG. 13 is a cross-sectional view taken along a line XIII-XIII in FIG. 10.

As shown in FIG. 10, the body portion 100 is arranged at the center portion of the wiring substrate 11 in the state where the drain terminal portions 101 project form the right side surface of the body portion 100 and the source terminal portions 102 and the gate terminal portion 103 project from the left side surface of the body portion 100. As shown in FIG. 11 to FIG. 13, the drain terminal portion 101 is electrically connected to the connecting portion 111a through the solder 14, and the drain predetermined portion is electrically connected to the connecting portion 111b through the solder 14. As shown in FIG. 11, the source terminal portion 102 is electrically connected to the connecting portion 112a through the solder 14. As shown in FIG. 12, the gate terminal portion 103 is electrically connected to the connecting portion 113a through the solder 14.

The case member 12 shown in FIG. 1 is a metallic board covering and protecting the wiring substrate 11 to which the FET module 10 is electrically connected. As shown in FIG. 11 to FIG. 13, the case member 12 opposes to the wiring substrate 11 and is spaced from the wiring substrate 11. A surface of the case member 12 opposing to the wiring substrate 11 is located higher than a surface of the body portion 100 opposing to the case member 12. That is, the surface of the body portion 100 opposing to the case member 12 is located further from the wiring substrate 11 than the surface of the body portion 100 opposing to the case member 12.

The heat conducting member 13 is a gel member having the electrical insulation property. The heat conducting member 13 thermally connects the wiring patterns 111 to 113 and the heat conducting patterns 114, 115 to the case member 12. As shown in FIG. 10 to FIG. 13, the heat conducting member 13 thermally connects predetermined portions of the wiring patterns 111 to 113 and the heat conducting patterns 114, 115 to the surface of the case member 12 opposing to the wiring substrate 11. The predetermined portions of the wiring patterns 111 to 113 are nearby areas of the connecting portions 111a, 112a and 113a. Also, the heat conducting member 13 thermally connects the body portion 100, the drain terminal portions 101, the source terminal portions 102 and the gate terminal portion 103 to the surface of the case member 12 opposing to the wiring substrate 11. That is, the predetermined portions of the wiring patterns 111 to 113, the heat conducting patterns 114, 115, the body portion 100, the drain terminal portions 101, the source terminal portions 102 and the gate terminal portion 103 are thermally connected to a predetermined heat conduction region of the case member 12 through the heat conducting member 13. The predetermined heat conduction region is a part of the surface of the case member 12 opposing to the wiring substrate 11. The predetermined heat conduction region is located further from the wiring substrate 11 than the surface of the body portion 100 opposing to the case member 12.

Next, radiation of the motor control device of the first embodiment will be described with reference to FIG. 10 to FIG. 13.

In the motor control device 1 shown in FIG. 10 to FIG. 13, when an electronic current flows to the FET module 10, the semiconductor chip 104 generates heat. As shown in FIG. 10 to FIG. 12, the heat generated in the semiconductor chip 104 is conducted to the case member 12 through the drain terminal member 105, the solder 14, the wiring pattern 111, the solder resist 116 and the heat conducting member 13. As shown in FIG. 10 and FIG. 13, the heat generated in the semiconductor chip 104 is conducted to the case member 12 through the drain terminal member 105, the solder 14, the wiring pattern 111, the heat conducting patterns 114, 115, the solder resist 116 and the heat conducting member 13. Also, as shown in FIG. 10 to FIG. 13, the heat generated in the semiconductor chip 104 is conducted to the case member 12 through the heat conducting member 13 from the body portion 100, the drain terminal portions 101, the source terminal portions 102 and the gate terminal portion 103. Finally, the heat generated in the semiconductor chip 104 is radiated outside from the case member 12.

Next, effects of the electronic device of the first embodiment will be described.

According to the first embodiment, the motor control device 1 includes the heat conducting member 13. The heat conducting member 13 thermally connects the wiring patterns 111 to 113 of the wiring substrate 11 and the like to the predetermined heat conduction region of the case member 12. Therefore, the case member 12 needs not to have a portion projecting toward the wiring substrate 11 to a position nearer the wiring patterns 111 to 113 and the like than the surface of the body portion 100 opposing to the case member 12. Hence, the heat generated in the semiconductor chip 104 can be radiated from the case member 12 with a simple shape. Since the projecting portion of the case member 12 is not arranged near the FET module 10, the short is less likely to occur. Also, the motor control device 1 includes the wiring substrate 11 having the heat conducting patterns 114, 115. The heat conducting patterns 114, 115 are disposed at the terminal non-corresponding areas of the surface of the wiring substrate 11. The surfaces of the heat conducting patterns 114, 115 are covered with the solder resist 116. The wiring patterns 111 to 113, which are electrically connected to the drain terminal portions 101, the source terminal portions 102 and the gate terminal portion 103, are disposed at the terminal corresponding areas of the surface of the wiring substrate 11. On the other hand, the wiring patterns 111 to 113 need not to be disposed at the terminal non-corresponding areas of the surface of the wiring substrate 11. Therefore, the heat conducting patterns 114, 115 can be disposed at the terminal non-corresponding areas. As such, an area of a heat conducting passage can be increased compared to a case where the heat is conducted to the case member 12 only through the wiring patterns 111 to 113. That is, thermal resistance can be decreased and heat radiation performance can be increased. As a result, an occurrence of the short can be restricted and the heat radiation performance can be increased without complicating a shape of the case member 12.

According to the first embodiment, the heat conducting patterns 114, 115 are disposed along the terminal non-projecting surface of the body portion 100. Therefore, a distance from the body portion 100 to the heat conducting patterns 114, 115 decreases, and the thermal resistance of the heat conducting passage decreases. As a result, the heat radiation performance can be increased.

According to the first embodiment, the FET module 10 has the drain terminal member 105. The drain terminal member 105 includes the drain terminal portions 101 and the drain predetermined portion. The drain predetermined portion is exposed from the bottom surface of the body portion 100 and electrically connected to the connecting portion 111b. Therefore, the area of the heat conducting passage from the semiconductor chip 104 to the wiring pattern 111 can be increased compared to a case where only the drain terminal portions 101 are electrically connected to the connecting portions 111a. As a result, the thermal resistance of the heat conducting passage can be decreased and the heat radiation performance can be increased.

According to the first embodiment, the heat conducting member 13 thermally connects the body portion 100, the drain terminal portions 101, the source terminal portions 102 and the gate terminal portion 103 to the predetermined heat conduction region of the case member 12. The heat generated in the semiconductor chip 104 can be conducted to the case member 12 through the body portion 100, the drain terminal portions 101, the source terminal portions 102, the gate terminal portion 103 and the heat conducting member 13. Therefore, the area of the heat conduction passage can be increased compared to a case where the heat generated in the semiconductor chip 104 can be conducted to the case member 12 only through the wiring patterns 111 to 113, the heat conducting patterns 114, 115 and the heat conducting member 13. As a result, the thermal resistance can be decreased and the heat radiation performance can be increased.

According to the first embodiment, the heat conducting patterns 114, 115 are integrally formed with the wiring pattern 111. Therefore, a structure of the wiring substrate 11 can be simplified.

According to the first embodiment, a semiconductor module composing the motor control device 1 is the FET module 10. Therefore, in the motor control device 1 including the FET module 10, the occurrence of the short can be restricted and the heat radiation performance can be increased without complicating the shape of the case member 12.

Although an example where the heat conducting patterns 114, 115 are disposed at the terminal non-corresponding areas of the wiring substrate 11 is described in the first embodiment, the present disclosure is not limited to the example. The heat conducting pattern may be disposed at one of the terminal non-corresponding areas, other than the terminal corresponding areas.

Although a case where the heat conducting patterns 114, 115 are integrally formed with the wiring pattern 111 is described, the present disclosure is not limited to the example. Although heat conductivity decreases slightly, the heat conducting patterns may not be integrally formed with the wiring pattern 111.

Second Embodiment

A motor control device of a second embodiment will be described. The motor control device of the second embodiment has a FET module having a different structure from the motor control device of the first embodiment.

Since the structure of the motor control device of the second embodiment other than the FET module is similar to the first embodiment, the description thereof will not be repeated. The structures of the FET module and the motor control device will be described with reference to FIG. 14 to FIG. 19.

Figure 14:
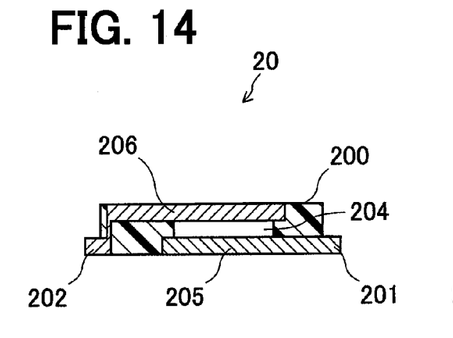
FIG. 14 is a cross-sectional view of a FET module of a second embodiment taken along a line corresponding to the line of FIG. 2.
Figure 15:
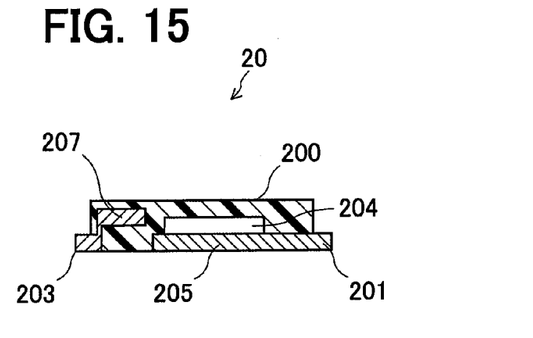
FIG. 15 is a cross-sectional view of the FET module of the second embodiment, taken along a line corresponding to the line IV-IV of FIG. 2.
Figure 16:
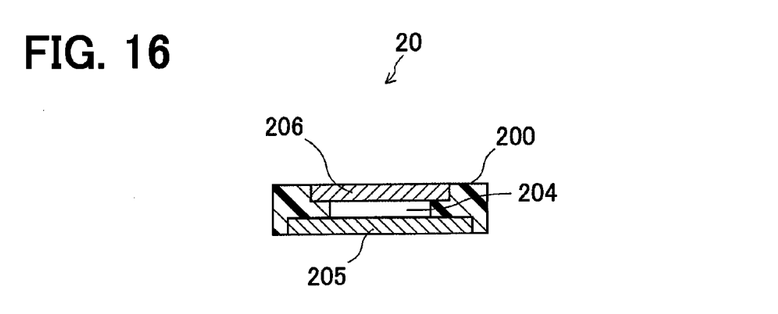
FIG. 16 is a cross-sectional view of the FET module of the second embodiment, taken along a line corresponding to the line V-V of FIG. 2.

As shown in FIG. 14 to FIG. 16, a FET module 20 structurally includes a semiconductor chip 204, a drain terminal member 205, a source terminal member 206 (a second terminal member) and a gate terminal member 207.

The semiconductor chip 204 and the drain terminal member 205 shown in FIG. 14 to FIG. 16 are the same chip and member as the semiconductor chip 104 and the drain terminal member 105 of the first embodiment.

The source terminal member 206 shown in FIG. 14 and FIG. 16 is the same member as the source terminal member 106 of the first embodiment. However, differently from the source terminal member 106 of the first embodiment, a predetermined portion of the source terminal member 206 other than source terminal portions 202 and disposed above the semiconductor chip 204 is exposed from a surface of a body portion 200 opposing to a case member 22. That is, the predetermined portion of the source terminal member 206 is exposed from an upper surface of the body portion 200.

The gate terminal member 207 shown in FIG. 15 is the same member as the gate terminal member 107 of the first embodiment.

Figure 17:
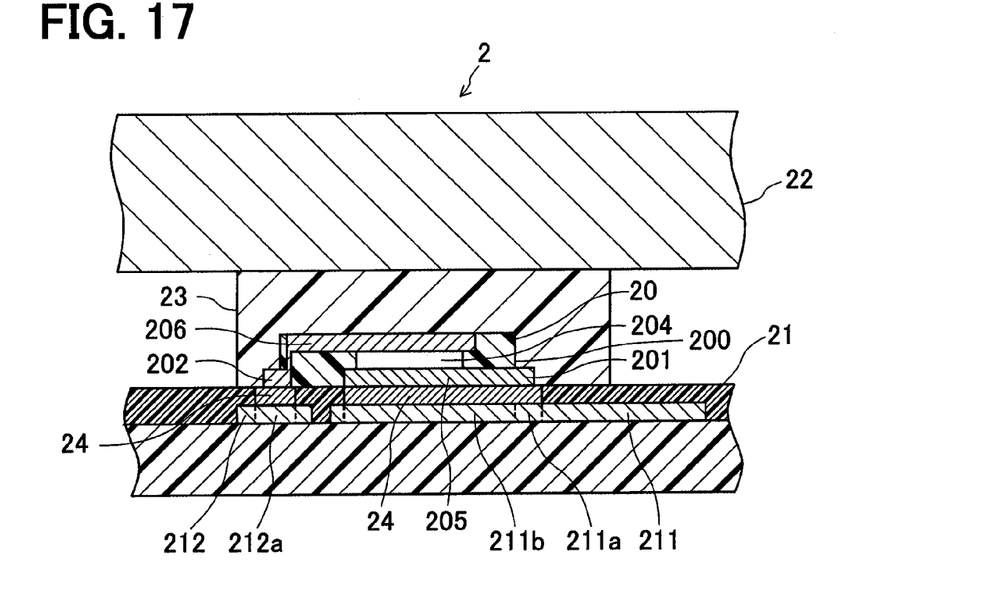
FIG. 17 is a cross-sectional view of a motor control device of the second embodiment, taken along a line corresponding to the line XI-XI of FIG. 2.
Figure 18:
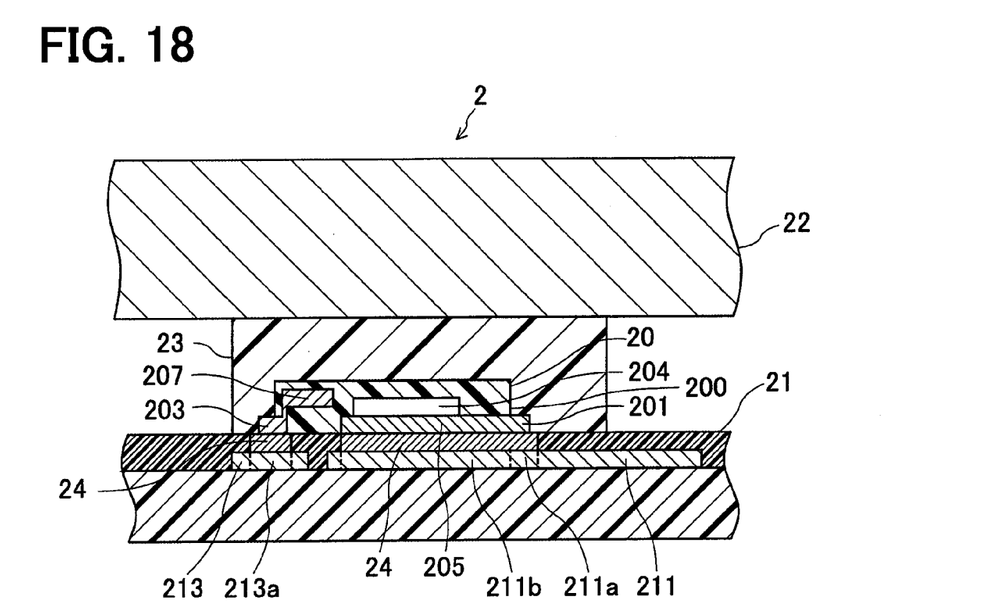
FIG. 18 is a cross-sectional view of the motor control device of the second embodiment, taken along a line corresponding to the line XII-XII of FIG. 2.
Figure 19:
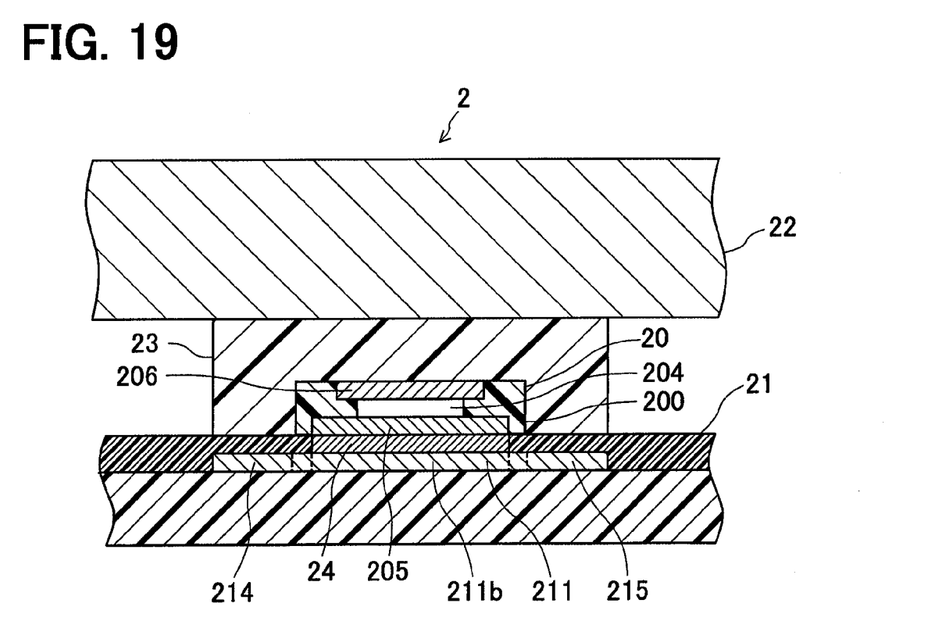
FIG. 19 is a cross-sectional view of the motor control device of the second embodiment, taken along a line corresponding to the line XIII-XIII of FIG. 2.

As shown in FIG. 17 to FIG. 19, similar to the drain terminal portions 101, the drain predetermined portion of the drain terminal member 105, the source terminal portions 102 and the gate terminal portion 103 of the first embodiment, drain terminal portions 201, drain predetermined portion of the drain terminal member 205, the source terminal portions 202 and gate terminal portion 203 are electrically connected to connecting portions 211a, 211b, 212a, 213a through solder 24. The connecting portions 211a, 211b, 212a, 213a are portions of wiring patterns 211, 212, 213 disposed in a wiring substrate 21.

Similar to the heat conducting member 13 of the first embodiment, a heat conducting member 23 thermally connects predetermined portions of the wiring patterns 211 to 213, the heat conducting patterns 214, 215, the body portion 200, the drain terminal portions 201, the source terminal portions 202 and the gate terminal portions 203 to a surface of the case member 22 opposing to the wiring substrate 21. The predetermined portions of the wiring patterns 211 to 213 are nearby areas of the connecting portions 211a, 212b and 213a.

Next, radiation of the motor control device 2 of the second embodiment will be described with reference to FIG. 17 to FIG. 19.

In the motor control device 2 shown in FIG. 17 to FIG. 19, when an electronic current flows to the FET module 20, the semiconductor chip 204 generates heat. The heat generated in the semiconductor chip 204 is radiated outside through a heat conducting passage similar to the motor control device 1 of the first embodiment. Since the predetermined portion of the source terminal member 206 is exposed from the upper surface of the body portion 200, the heat generated in the semiconductor chip 204 is conducted to the case member 22 through the source terminal member 206 and the heat conducting member 23, and radiated from the case member 22.

Next, effects of the electronic device of the second embodiment will be described.

According to the second embodiment, since the electronic device of the second embodiment has the similar structure to the first embodiment, similar effects to the first embodiment can be achieved.

According to the second embodiment, the FET module 20 has the source terminal member 206. The source terminal member 206 includes the source terminal portions 202 and the predetermined portion disposed above the semiconductor chip 204. The predetermined portion of the source terminal member 206 is exposed from the upper surface of the body portion 200. The heat generated in the semiconductor chip 204 is conducted to the case member 22 through the source terminal member 206 and the heat conducting member 23. Therefore, an area of the heat conducting passage can be increased more than the motor control device 1 of the first embodiment. As a result, thermal resistance can be decreased and the heat radiation performance can be increased compared to the motor control device 1 of the first embodiment.

Although an example where the predetermined portion of the source terminal member 206 is exposed from the upper surface of the body portion 200 is described in the second embodiment, the present disclosure is not limited to the example. The predetermined portion of the source terminal member 206 may be exposed from terminal non-projecting surfaces of the body portion 200. Also, the gate terminal member 207 may be exposed.

Although an example where the heat conducting patterns 214, 215 are integrally formed with the wiring pattern 211, similar to the first embodiment, is described, the present disclosure is not limited to the example. Although the heat conductivity decreased slightly, the heat conducting patterns 214, 215 may not be integrally formed with the wiring pattern 211.

While only the selected exemplary embodiments and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments and examples according to the present disclosure is provided for illustration only, and not for the purpose of limiting the disclosure as defined by the appended claims and their equivalents.

What is claimed is:

1. An electronic device comprising:
a semiconductor module having a body portion with a rectangular parallelepiped shape and a plurality of terminal portions projecting from two of four side surfaces of the body portion, the two of the four side surfaces of the body portion being referred to as terminal projecting surfaces, the other two of the four side surfaces of the body portion being referred to as terminal non-projecting surfaces;
a wiring substrate having a plurality of wiring patterns and a heat conducting pattern, surfaces of the plurality of wiring patterns other than a plurality of connecting portions to which the terminal portions of the semiconductor module are electrically connected and a surface of the heat conducting pattern being covered with solder resist, and the heat conducting pattern being disposed adjacent to at least one of the terminal non-projecting surfaces of the body portion on a surface of the wiring substrate;
a case member opposed to the wiring substrate and spaced from the wiring substrate; and
a heat conducting member thermally connecting predetermined portions of the wiring patterns and the heat conducting pattern to a predetermined heat conduction region of the case member, the predetermined heat conduction region being a surface of the case member opposing to the wiring substrate and being located further from the wiring substrate than a surface of the body portion opposition to the case member, wherein the heat conducting member thermally connects the body portion and the terminal portions to the predetermined heat conduction region of the case member.

2. The electronic device according to claim 1, wherein the heat conducting pattern is disposed along at least one of the terminal non-projecting surfaces of the body portion.

3. The electronic device according to claim 1, wherein the semiconductor module has a first terminal member, and
the first terminal member includes at least one of the terminal portions and a predetermined portion that is exposed from a surface of the body portion opposing to the wiring substrate and electrically connected to at least one of the connecting portions of the wiring patterns.

4. The electronic device according to claim 1, wherein the semiconductor module has a second terminal member, and
the second terminal member includes at least one of the terminal portions and a predetermined portion that is exposed from the surface of the body portion opposing to the case member.

5. The electronic device according to claim 1, wherein the heat conducting pattern is integrally formed with at least one of the wiring patterns.

6. The electronic device according to claim 1, wherein the semiconductor module is a FET module.

7. The electronic device according to claim 1, wherein the predetermined portions of the wiring patterns are nearby areas of the connecting portions of the wiring patterns.

* * * * *